United States Patent [19]
Kato et al.

[11] Patent Number: 5,942,445
[45] Date of Patent: Aug. 24, 1999

[54] METHOD OF MANUFACTURING SEMICONDUCTOR WAFERS

[75] Inventors: Tadahiro Kato; Hisashi Masumura; Sadayuki Okuni; Hideo Kudo, all of Nishigou-mura, Japan

[73] Assignee: Shin-Etsu Handotai Co., Ltd., Tokyo, Japan

[21] Appl. No.: 08/823,746

[22] Filed: Mar. 25, 1997

[30] Foreign Application Priority Data

Mar. 25, 1996  [JP]  Japan .................................. 8-094878

[51] Int. Cl.⁶ .................................................. H01L 21/302
[52] U.S. Cl. ........................... 438/691; 438/692; 438/706
[58] Field of Search ................................... 438/692, 689, 438/690, 691, 706

[56] References Cited

U.S. PATENT DOCUMENTS

| | | |
|---|---|---|
| 4,390,392 | 6/1983 | Robinson et al. . |
| 5,700,179 | 12/1997 | Hasegawa et al. ........................ 451/41 |
| 5,800,725 | 9/1998 | Kato et al. ............................... 438/692 |

FOREIGN PATENT DOCUMENTS

| | | |
|---|---|---|
| 558327 A1 | 9/1993 | European Pat. Off. . |
| 588055 A2 | 3/1994 | European Pat. Off. . |
| 628992 A2 | 12/1994 | European Pat. Off. . |
| 754785 A1 | 1/1997 | European Pat. Off. . |
| 19626396 A1 | 1/1997 | Germany . |

OTHER PUBLICATIONS

Wolf et al., "Silicon Processing for the VLSI Era", vol. 1, pp. 546–547 1986.

J. Haisma et al. (1994) "Improved Geometry of Double–Sided Polished Parallel Wafers Prepared for Direct Wafer Bonding". Applied Optics 33:7945–54.

Patent Abstracts of Japan vol. 4, No. 165, Nov. 15, 1980. Abstract of JP 55–113332.

*Primary Examiner*—Benjamin Utech
*Assistant Examiner*—Kin-Chan Chen
*Attorney, Agent, or Firm*—Evenson, McKeown, Edwards & Lenahan, P.L.L.C.

[57] ABSTRACT

According to the invention, the flatness and quality can be improved while simplifying the process even when large size wafers of 200 to 300 mm or above are processed. Basic steps involved are a slicing step E for obtaining thin disc-shape wafers by slicing, a chamfering step F for chamfering the sliced wafers, a flattening step G for flattening the chamfered wafers, an alkali etching step H for removing process damage layers from the flattened wafers, and a double-side polishing step K of simultaneously polishing the two sides of the etched wafers. If necessary, a plasma etching step is used in lieu of the flattening and etching steps G and H respectively.

20 Claims, 11 Drawing Sheets

(A)

(B)

Manufacturing Process of Fig. 2 (C)

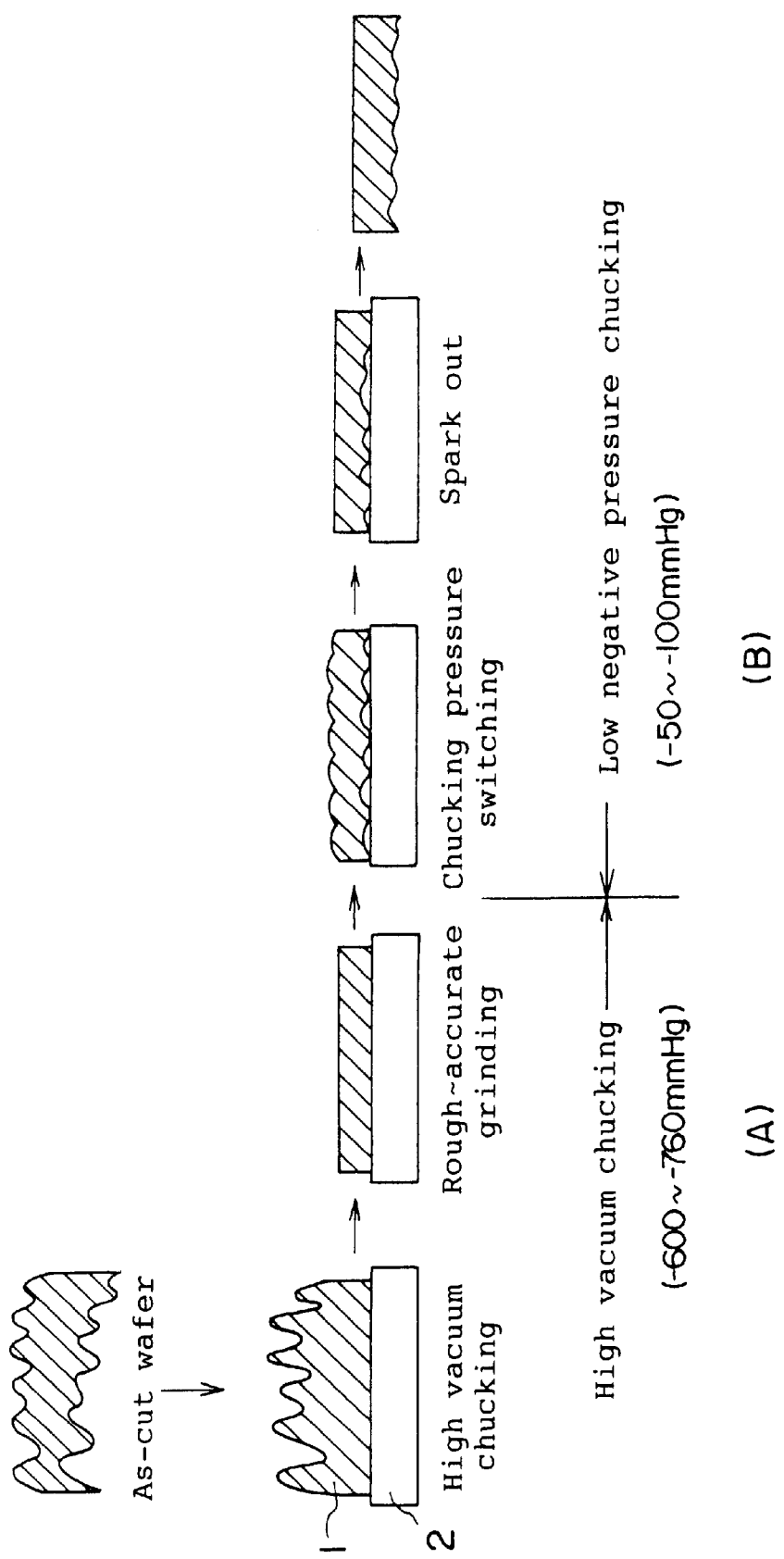

METHOD OF MANUFACTURING SEMICONDUCTOR WAFERS

BACKGROUND OF THE INVENTION

1. Field of the Invention

This invention relates to methods of manufacturing semiconductor wafers, particularly single crystal silicon wafers.

2. Description of the Prior Art

A prior art method of manufacturing semiconductor wafers comprises a slicing step for obtaining thin disc-shape wafers through slicing a single crystal ingot obtained through pulling by using a single crystal pulling apparatus, a chamfering step for chamfering an outer periphery edge of a wafer for preventing chips and cracks of said sliced wafer, a lapping step for flattening the chamfered wafer surfaces, a wet etching step for removing a process damage layers remaining on the chamfering and lapping, a single-side mirror-polishing step for mirror-polishing one side surface of the etched wafers and a washing step for improving the cleanliness thereof by removing an abrasive and foreign particles remaining on the polished wafers.

The individual steps in the above prior art method, however, have various problems. In the first slicing step, in which the ingot is sliced into the thin disc-shape wafers with a circular internal blade slicer or a wire saw, a slight difference between right and left side of cutting resistances offered to the slicing blade prevent straight advancement of the blade cutting. As a result, swelling or warp is generated on the cutting surface. Such swelling or warp is a cause of cumbersome and troublesome processes in the subsequent steps.

In the lapping step, the warp cannot be removed although the swelling can be removed.

In the etching step, mixed acid or alkali aqueous solution is used as etching solution to remove the process damage layers which are generated by the previous mechanical processing. However, the flatness of the wafer surface is influenced by the activity of the etching solution, and it is required to remove the process damage layers while maintaining the flatness.

The polishing step uses a mechanical/chemical polishing process consisting of a plurality of stages, and a highly accurate mirror finish is obtained highly efficiently with a composite geometric effect in the dynamic function of mechanical polishing and the chemically removing function of etching. These functions are influenced by the proportions of mechanical element and chemical element during the polishing.

Japanese Patent Application Heisei 6-227291, filed by the applicant and not publicly known, proposes means for reducing swelling of as-cut wafers right after the above slicing process and before lapping, particularly unevenness or swelling of long cycles of 0.5 to 30 mm, as shown in FIG. 10. To preclude the long cycle swelling noted above, instead of holding a wafer 1 such that the back surface 1b thereof is directly chucking on the surface of chucking base plate 2 as shown in (A), wax or like adhesive 3 is provided between the wafer 1 and the base plate 2 as shown in (B), for absorbing long cycle unevenness or swelling etc. on the back surface 1b. (This technique is hereinafter referred to as first grinding technique.)

In this technique, with the wafer back surface 1b secured to the upper surface of the base plate 2 via the intervening adhesive 3, the unevenness of the back wafer surface 1b is held absorbed in the adhesive 3. In the other words, the adhesive 3 serves as unevenness absorber, and the surface polishing of the wafer 1 thus can be done without elastic deformation thereof even with unevenness present on the wafer back surface 1b. It is thus possible to maintain the flatness of the ground front surface 1a even when the adhesion is released.

In this prior art technique (not well known), clearances formed by above "swelling" generated on them when a wafer or like thin work is set on the base plate 2, are filled to prevent their transfer to the front surface of the work. The adhesive 3 may be fused wax, hot-melt adhesive, gypsum, ice, etc.

In Japanese Patent Application Heisei 8-80719, not public known, the application proposes other means for reducing swelling of cycles of about 0.5 to 30 mm. This proposition uses a vertical in-feed surface grinding machine, which has a cup-shaped grindstone with a wafer setting turntable providing variable wafer chucking force. Hereupon, "the in-feeds grinding" is meant the method which feed the grindstone perpendicularly to its frictional rotation surface. In this case, in the final grinding stage, i.e., a spark-out time, the chucking pressure on the wafer is switched over to a low pressure to grind the work, thereby removing the swelling. (This technique is hereinafter referred to as ground as second grinding technique.)

Specifically, as shown in FIG. 11, in an initial stage of grinding the work 1 is held for grinding under a suction pressure close to the normal vacuum as shown in (A). However, in a final stage (or spark-out time, i.e., zero in-feed grinding time) in which the grindstone feed pressure is reduced or substantially zero, the suction pressure is reduced to a pressure, under which the holding pressure can be maintained, as shown in (B). By so doing, the surface grinding can be made in a state that the elastic deformation force of the wafer is substantially reduced while maintaining the holding force, and the flatness obtained by the surface grinding can be maintained even by releasing the chucking.

When the thin wafer as the work of the surface grinding process is as-cut wafer right after the slicing, the suction pressure close to vacuum is suitably −600 to −760 mm Hg, and the suction pressure in the state that the elastic deformation force of the wafer is substantially released is suitably −100 to −50 mm Hg.

As the etching means, "A System for Removing Material from Wafers" is proposed in Japanese Laid-Open Patent Publication Heisei 5-160074, and "A Method and an Apparatus for Noncontacting Plasma Polishing and Smoothing of Uniformly Thinned Substrates" is proposed in Japanese Laid-Open Patent Publication 6-5571. According to this proposal, shape data of wafer before etching is fed back to a local etching stock removal to improve the thickness accuracy and flatness accuracy of the wafer after the etching. This plasma etching system is capable of noncontacting control of the process by plasma-assisted chemical etching.

This system permits removal of process damage layers or the like without reducing the flatness of the wafer, and the feedback of the shape data permits fine flattening through control of high frequency power supplied reactivity plasma gas and variation of the speed of the wafer in an X-Y direction.

In the single-side mirror-finish polishing step, the front wafer surface having been etched in the preceding etching step is brought to the single-side mirror-finish polishing step and has no problem. However, on the back wafer surface in which the large surface roughness is left as it is, the sharp ends of unevenness are broken off by chipping, generating a large number of particles and reducing the yield.

To solve this problem, the applicant has earlier proposed a technique in Japanese Patent Application Heisei 7-207514, not well known (prior art).

According to this proposal, a double-side wafer polishing step is incorporated in a method of semiconductor manufacture to improve the flatness of polished wafer, and also dust particle generation due to chipping from the back wafer surface by polishing of double-side wafer is suppressed to improve the yield of the apparatus.

With recent high function diversification, performance improvement, super-miniaturization, light weightiness and integration density increase of semiconductor, the high quality and large size of a wafer as substrate have been improved, and it is difficult to obtain highly accurate flatness of wafers of 200 to 300 mm and above in size. As an up-to-date method of wafer manufacture on a coming age, a manufacturing technique permitting high flatness and quality improvement is desired particularly for wafers of increased sizes.

SUMMARY OF THE INVENTION

The invention seeks to provide a method of semiconductor wafer manufacture, which while reducing the process, permits high flatness and quality improvement particularly even though the diameter of those wafers might be increased to comply with the needs of the time. Particularly, the invention has an object of providing a method of semiconductor wafer manufacture suited for processing increased size wafers in a material processing for removing long cycle swelling generated on as-cut wafers and also removing a process damage layers, these removals having been impossible by conventional lapping, by combining the above various prior application techniques and prior art techniques, such that the process has no adverse effects on subsequent process stages, while further preventing generation of particles by single-side polishing.

A more specific object of the invention is to provide a method of semiconductor wafer manufacture, in which surface grinding means is used for a flattening step to remove warp of as-cut wafers, which has been difficult by lapping as problem of conventional process, while preventing particle generation in a double-side polishing.

Another object of the invention is to provide a method of semiconductor wafer manufacture, which permits effective removal of cutting particles and process damage layers due to mechanical processing up to the flattening step.

A further object of the invention is to provide a method of semiconductor wafer manufacture, in which first grinding means based on double-side grinding is introduced to remove wafer shape fluctuations due to batch processing of wafers while reforming warp or swelling of an as-cut wafer generated at the time of slicing an ingot, and subsequently the work is highly accurately flattened by using the second grinding means.

A still further object of the invention is to provide a method of semiconductor wafer manufacture, which permits effective removal of cutting particles and process damage layers from wafers while maintaining the flatness thereof.

A yet further object of the invention is to provide a method of semiconductor wafer manufacture, in which a plasma etching step is effectively introduced to effect flattening of and process damage layers removal from wafers at a time, while preventing particle generation.

A history until completion of the present invention will now be described.

Problems posed in the manufacture of large size wafers are flatness improvement and quality improvement such as removal of cutting particles and process damage layers. A technique for solving these problems is a basis of techniques for manufacturing future wafers. As such a technique, the applicant studied the double-side polishing technique shown in the Japanese Patent Application Heisei 7-207514 (prior application technique) noted above.

The double-side polishing technique will be briefly described.

The flatness of wafers obtainable in the prior art slicing step is 10 to 20 $\mu$m in terms of TTV (total thickness variation), i.e., the difference between the maximum and minimum wafer thicknesses. Besides, the wafer has process damage to a maximum depth of 30 $\mu$m on one side.

As described before, the long cycle swelling as mentioned before is generated in the slicing step.

In the instant prior application technique, after chamfering the wafers obtained by slicing, by double-side polishing the chamfered wafers using a hard polishing pad (with an Asker C hardness of 80 or above; JIS K6301), very satisfactory flatness (TTV) could be obtained with a single-side polishing stock removal of 30 $\mu$m or above. Also, it was found that process damage layer and swelling peculiar to the slicing can be removed.

However, although the double-side polishing system is for simultaneously polishing the two sides of a wafer with polishing pads applied to an upper and a lower plate, it is of batch type (of simultaneously polishing a plurality of wafers), and fluctuations of the thickness and flatness of the material supplied to the polishing step have great influence on the flatness of the polished wafers.

To be above to obtain highly accurate flatness with less polishing stock removal, it is necessary to supply as material the wafers having small thickness fluctuations and satisfactory flatness at a preceding process of the polishing step.

To solve this problem, the invention features flattening thin disc-shape wafers obtained right after slicing or after chamfering if desired, with predetermined surface grinding means, and grinding both-sided said flattened wafers by simultaneous double-side polishing, preferably using a hard polishing pad (with an Asker C hardness of 80 or above).

In this case, the surface grinding may be done on one wafer after another to maintain highly accurate flatness, while the double-side polishing may be done either by batch polishing or on a wafer after another.

In this case, prior to said double-side polishing, wafers may be processed one after another using a cup-shaped grindstone in-feed vertical surface grinding machine. By so doing, it is possible to supply wafers with stable thickness accuracy and flatness to the double-side polishing step.

The invention also features flattening thin disc-like wafers obtained right after slicing or after chamfering if desired, with predetermined surface grinding means, removing process damage layers from said flattened wafers while maintaining the flatness thereof by a predetermined etching process, and both-side polishing of said wafers after the process damage layer removal by simultaneous double-side polishing, suitably using hard polishing pad (with an Asker C hardness of 80 or above).

In this case, the etching process is suitably a wet etching process using an alkali solution as the etching solution.

By carrying out the etching process with an alkali solution after flattening with the surface grinding means, the surface roughness can be greatly improved, thus permitting great polishing stock removal reduction in the subsequent double-side polishing step.

Besides, the use of the alkali solution as the etching solution permits removal of cutting particles and process damage layers while reliably maintaining the flatness secured in the preceding step.

The surface grinding may be done with wax or like adhesive interposed between a wafer and a base plate surface supporting by suction the back surface of the wafer. Alternatively, the surface grinding may be done on the front surface of a wafer with the back surface thereof held chucked by a negative pressure, and the negative pressure for holding the thin work chucked (hereinafter referred to as chucking pressure) may be reduced in a final stage of grinding, preferably in a spark-out time when a grindstone feed pressure is reduced.

In either of the above techniques, it is possible to maintain the flatness of the wafer surface having a surface ground and obtain great removal of swelling on an as-cut wafer which has heretofore been impossible, thus permitting highly accurate material to be supplied to the double-side polishing step and contributing to the efficiency improvement.

The surface grinding step may be constituted by a first grinding step based on double-side grinding and a second grinding step based on cup-shaped grindstone in-feed surface grinding.

By introducing the double-side grinding step prior to the surface grinding, it is possible not only to get a wafer batch processing but also to form process damage layers on both wafer sides to impart both of these surfaces with balanced elastic distortions and prevent generation of the secondary warp. Particularly it is possible to reduce thickness fluctuations of the wafer. These effects can also be obtained when double-side polishing wafers by wafer batch processing.

Suitably, thin disc-like wafers obtained right after slicing or after chamfering if desired, are flattened with surface grinding means or lapping means, and after the removal of process damage layers from the flattened wafers and fine flattening thereof are done in a dry etching process using plasma, said wafers are both-side polished by simultaneous double-side polishing, preferably with hard polishing pad (with an Asker C hardness of 80 or above).

In this case, the flattening may be done in a dry etching process using plasma, so that it is possible to dispense with the flattening step by the surface grinding means or lapping means and flatten as-cut wafers obtained right after slicing, in a dry etching process using plasma directly, after the process damage layer removal and flattening, and both-side polish said flattened wafers by simultaneous double-side polishing, preferably using hard polishing pad (with an Asker C hardness of 80 or above).

It is further possible to flatten as-cut wafers obtained right after slicing with surface grinding means or lapping means and remove process damage layers from said flattened wafers while maintaining the flatness thereof in a predetermined etching process, further after the process damage layer removed by a dry etching process using plasma, both-side polish said flattened wafers by simultaneous double-side polishing, preferably using hard polishing pad (with an Asker C hardness of 80 or above).

In this case, the plasma etching means is suitably constructed such as to carry out chemical etching assisted by plasma.

Such a technique may be implemented by a system, in which wafer shape data before the etching is fed back to a local etching stock removal to improve the thickness accuracy and flatness accuracy of wafer after the etching. Such a system may employ a technique of PACE (plasma-assisted chemical etching) which is developed by Heuges Danbary Optical Systems Inc., according to the Japanese Laid-Open Patent Publication Heisei 6-5571.

By introducing such noncontact plasma-assisted chemical etching capable of feedback control to the material working step of double-side polishing particularly, it is possible to obtain mirror-finish polished wafers having highly accurate flatness.

Thus, according to the invention, by adopting a double-side polishing step for a polishing step in the prior art working process, which comprises the steps of wire saw slicing, lapping, etching and polishing, and adopting, in lieu of the lapping in the prior art process, a double-side grinding step and a surface grinding step with low pressure suction in a process of supplying the material to the polishing step, it is possible to greatly improve the flatness, suppress thickness fluctuations of material wafers and improve the production control in the double-side polishing.

The application of the plasma dry etching capable of the feedback control, permits finer flatness improvement and further production control improvement.

Thus, only according to the invention it is possible to improve the high flatness and quality while simplifying the process particularly on large size wafers of 200 to 300 mm and above.

BRIEF DESCRIPTION OF THE DRAWINGS

FIG. 2 is a flow chart which shows a shape in a case of leading a plasma dry etching step P in a manufacturing process of FIG. 1, in which:

Figure 1:
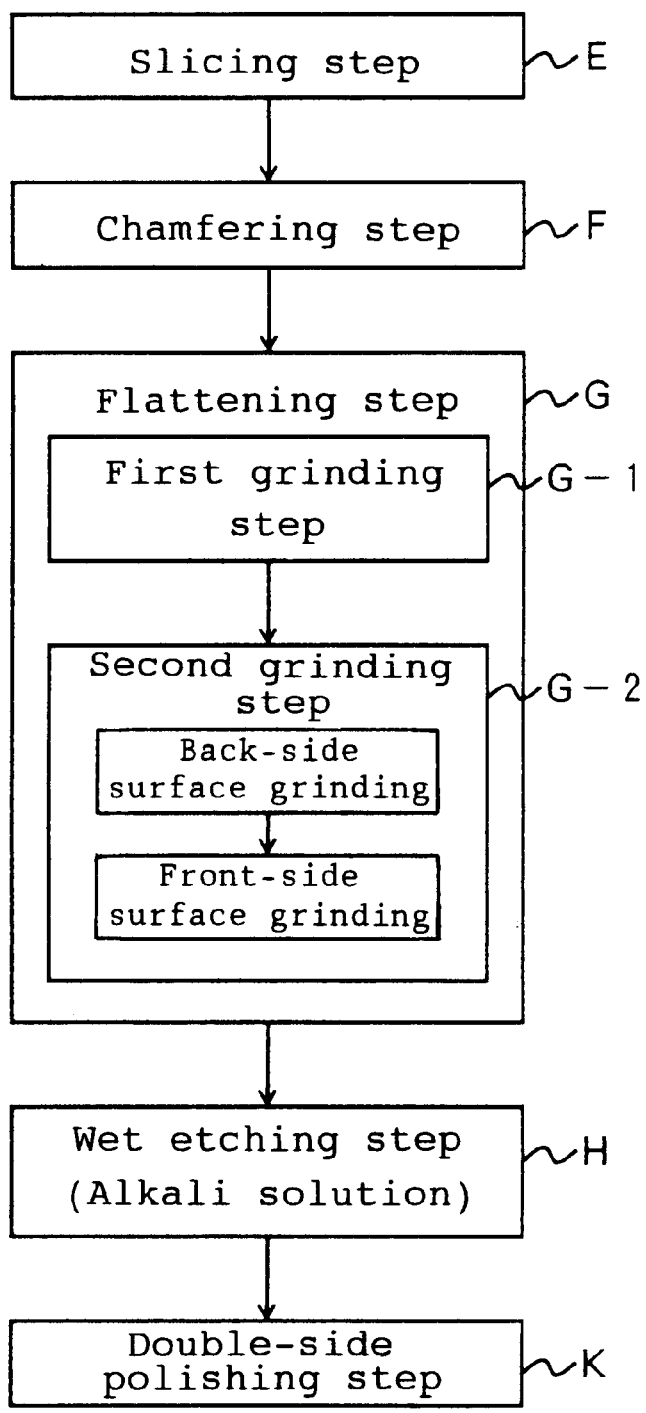
FIG. 1 is a flow chart illustrating a process of manufacturing semiconductor wafers in an embodiment of the invention.
Figure 3:
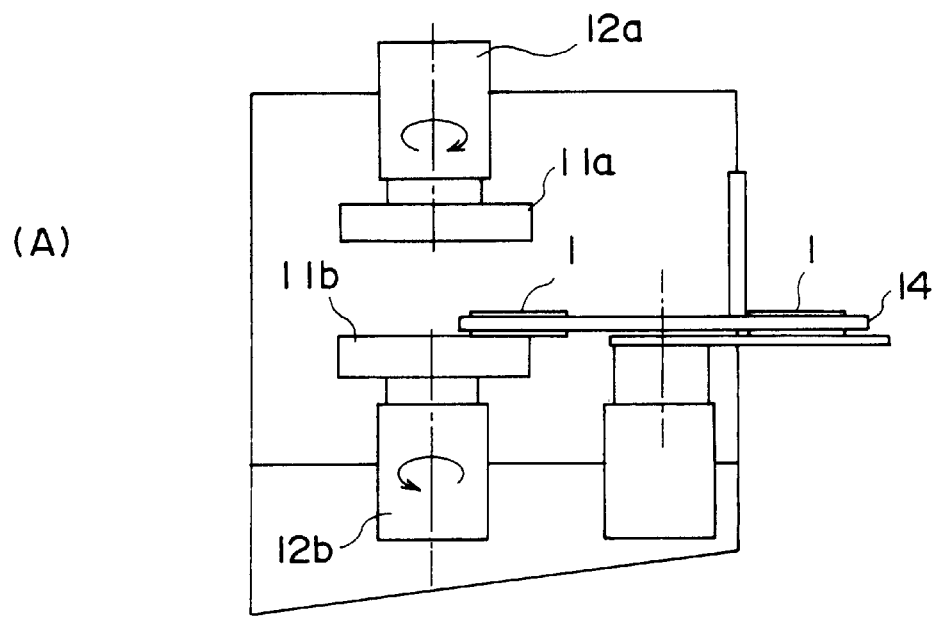
Figure 3:
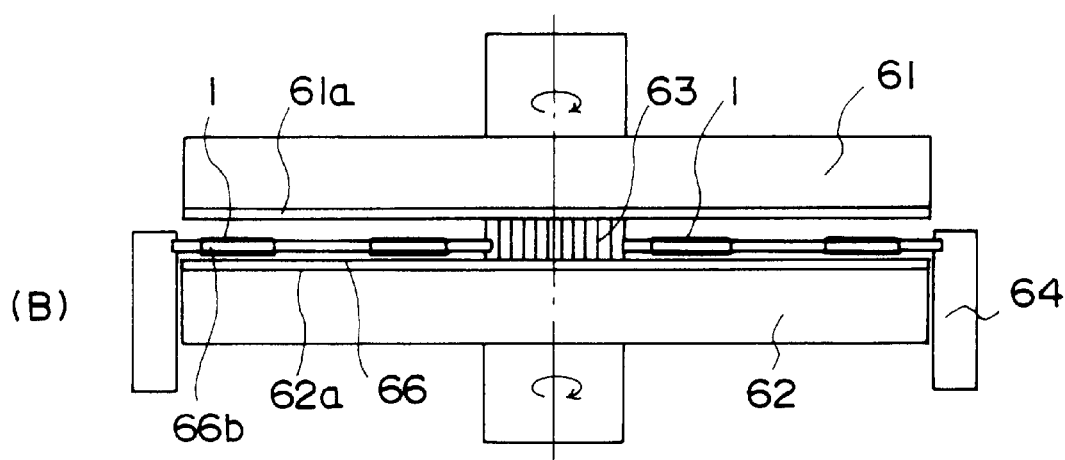
Figure 4:
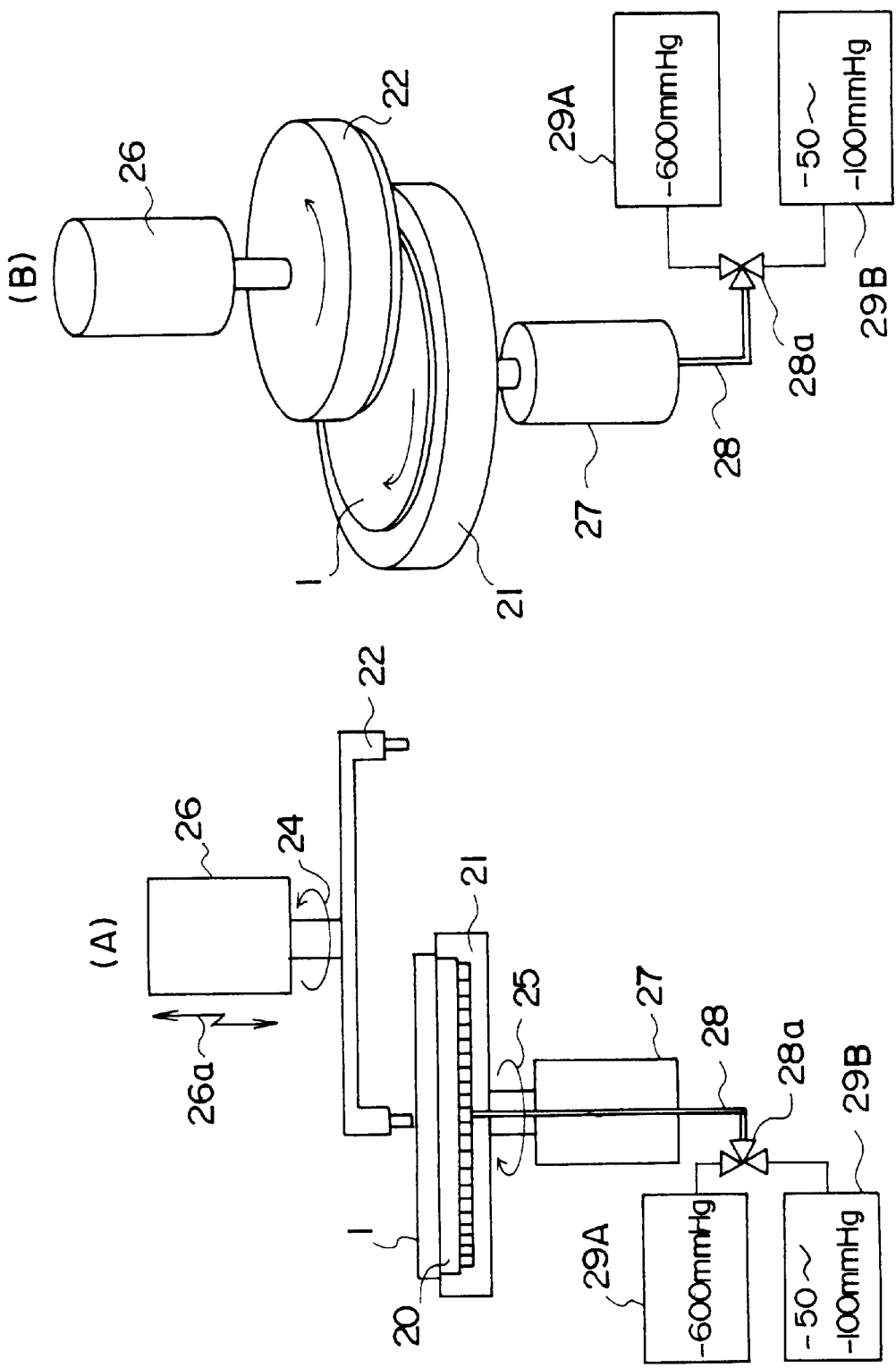
Figure 5:
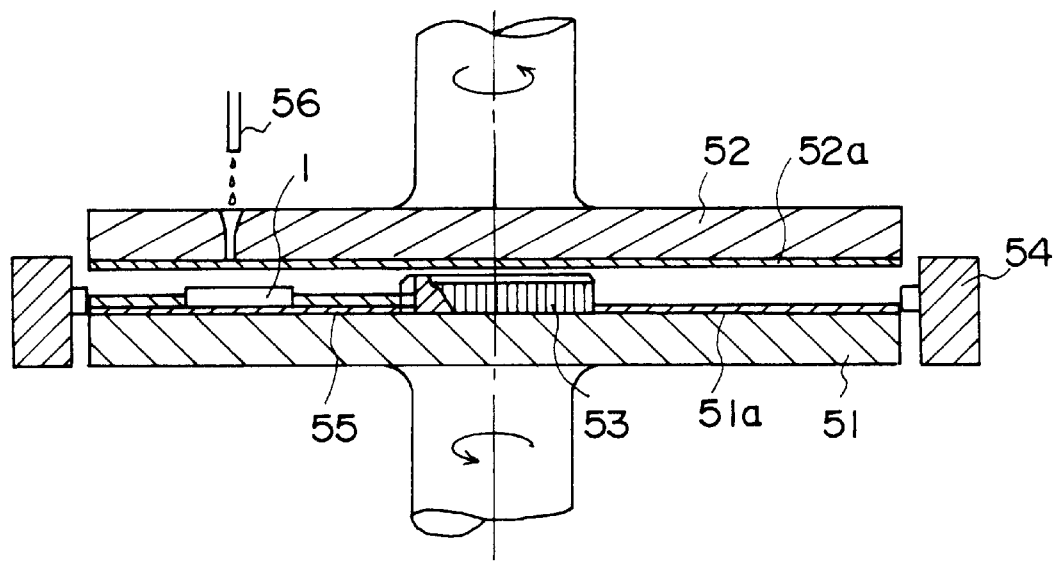
Figure 5:
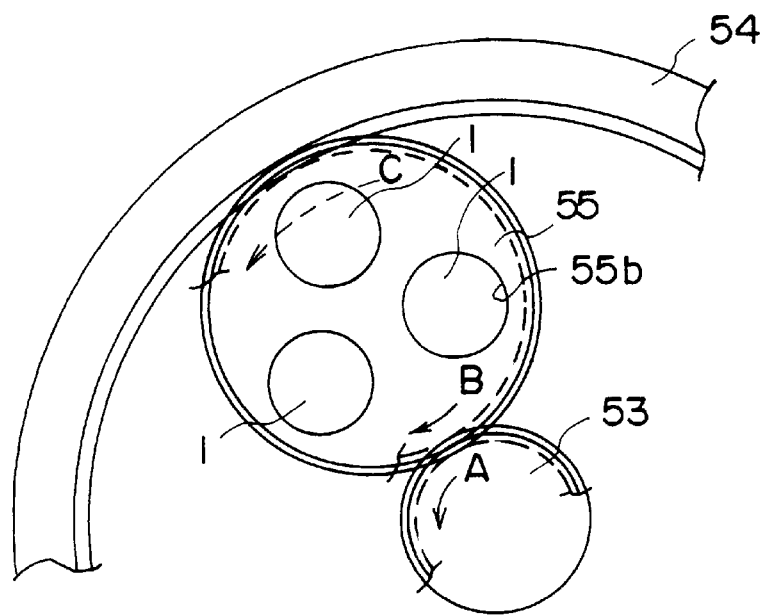
Figure 6:
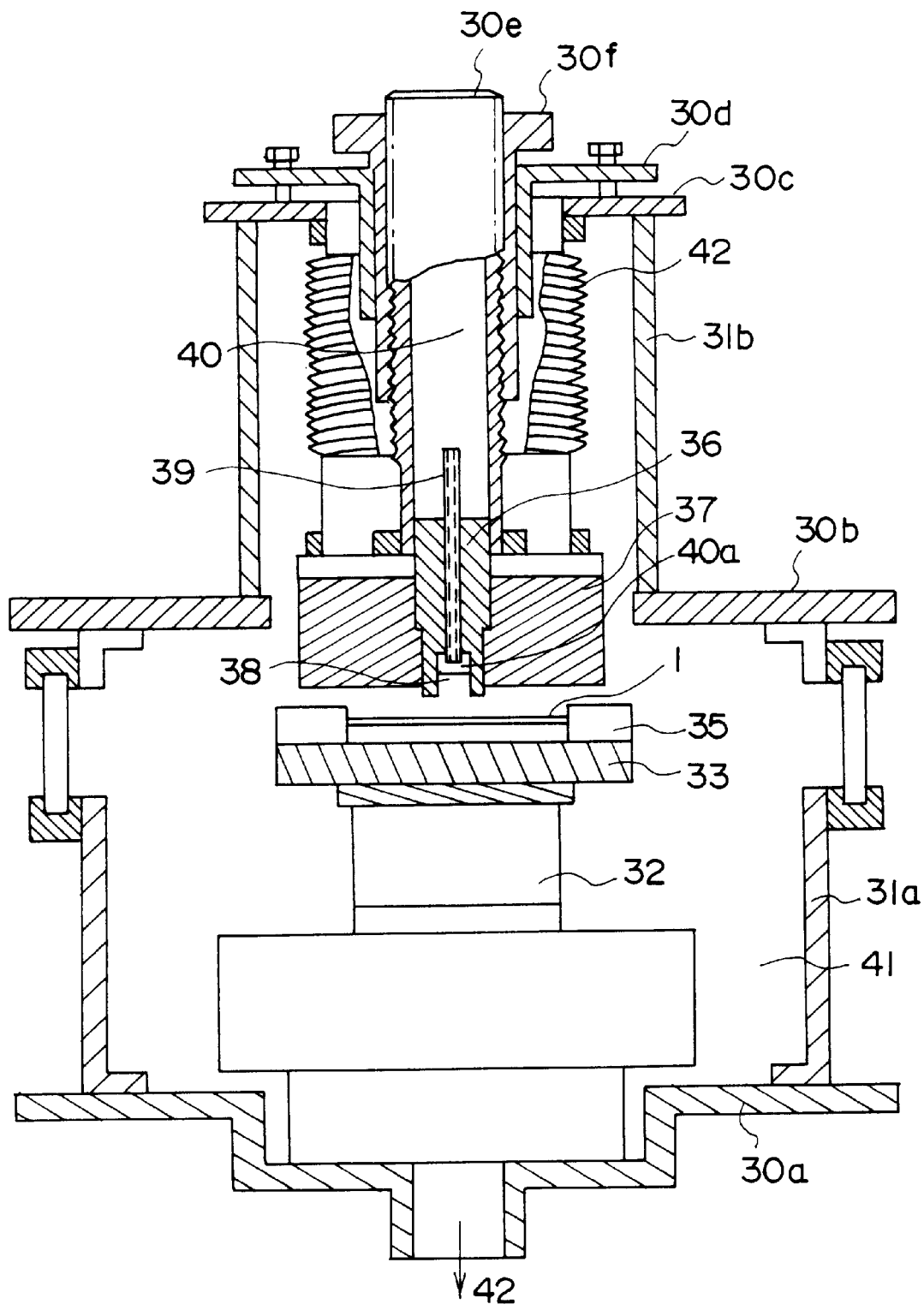
Figure 7:
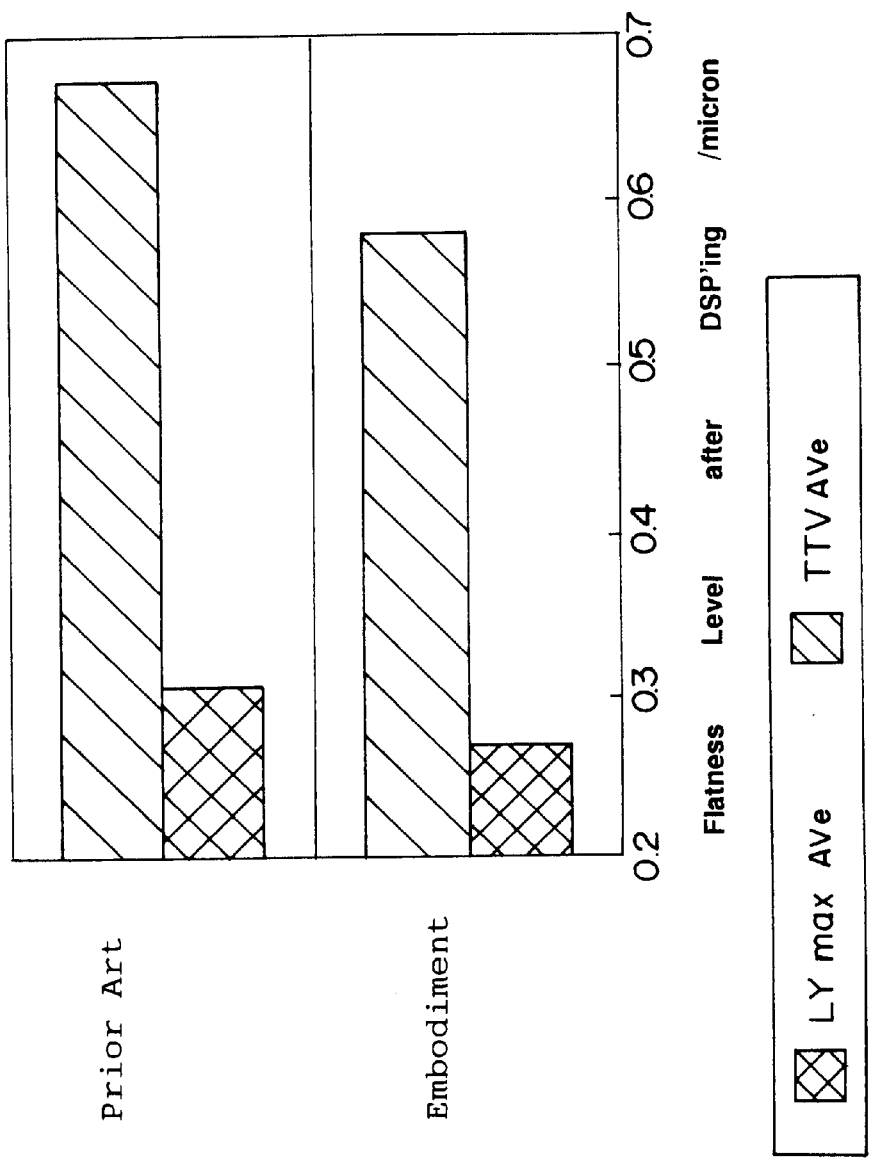
Figure 8:
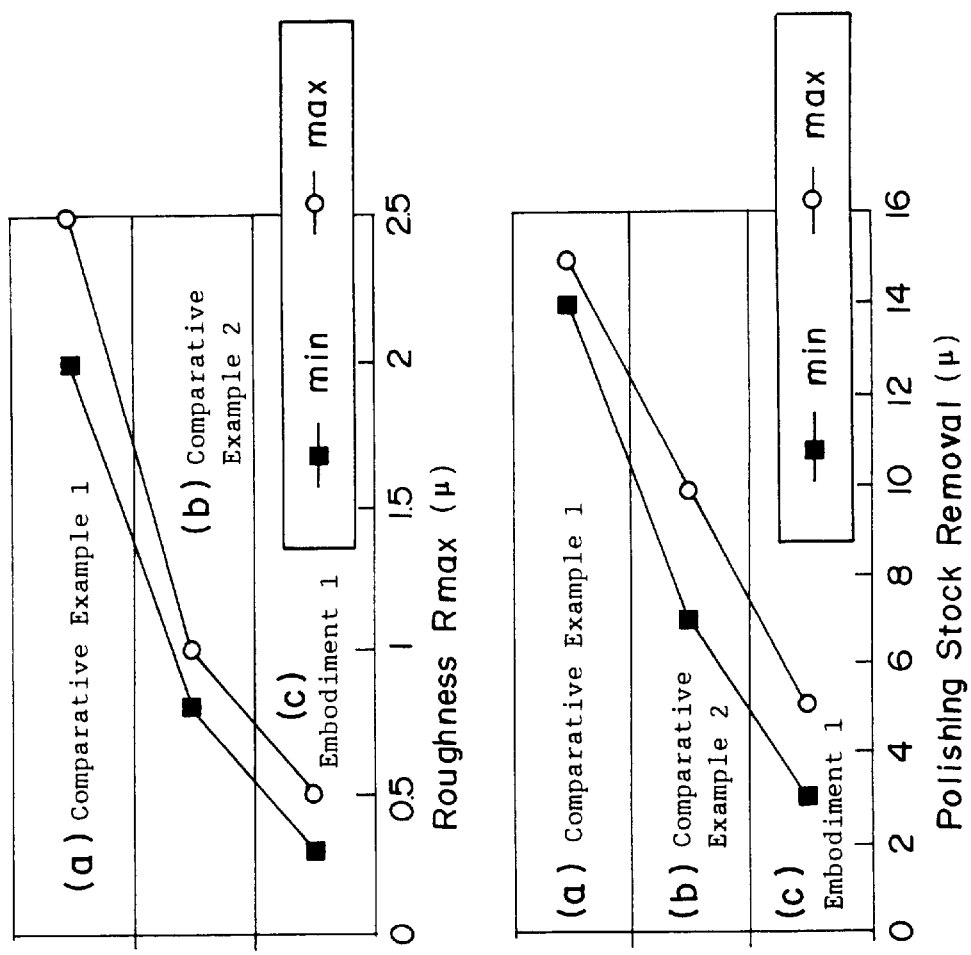
Figure 9:
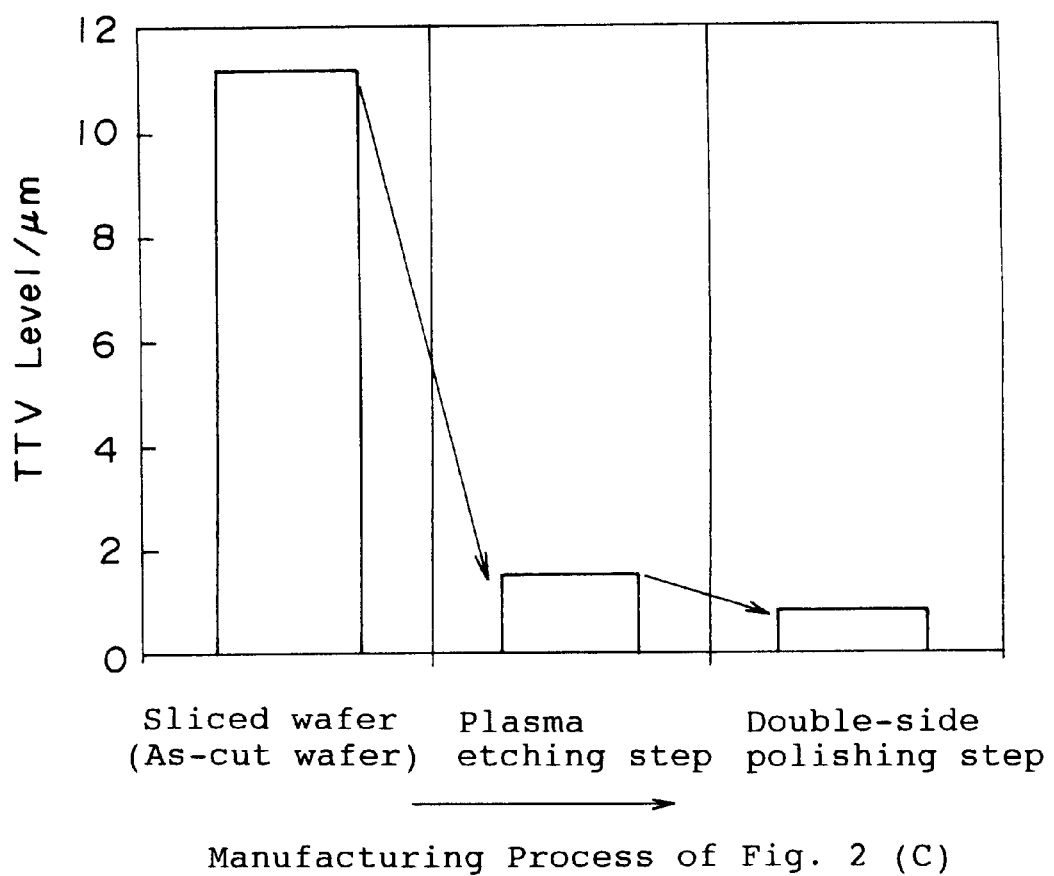
Figure 10:
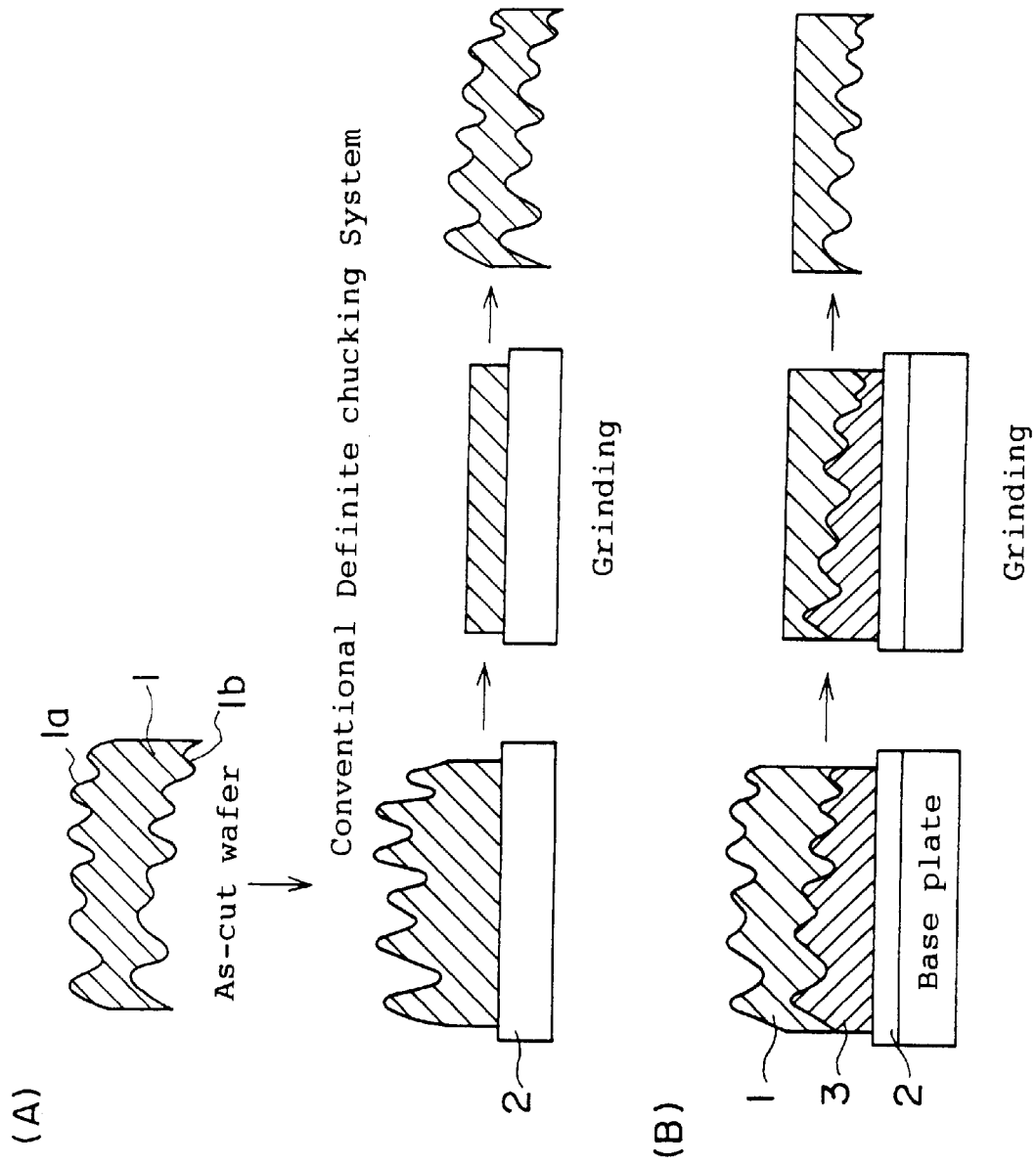

(A) illustrates a case of subjecting etched wafers obtained through steps E to H in FIG. 1 to the plasma dry etching process;

(B) illustrates a case of subjecting flattened wafers obtained through the steps E to G in FIG. 1 to the plasma dry etching process; and (C) illustrates a case of subjecting as-cut wafer formed by chamfering sliced wafers to the plasma dry etching process;

FIG. 3 shows schematic views showing double-side grinding machines, (A) showing a one-by-one grinding machine, and (B) showing a batch type grinding machine;

FIG. 4 shows a low-pressure surface grinding machine, (A) being a sectional view, (B) being a perspective view;

FIG. 5 shows a double-side polishing machine, (A) showing a vertical sectional view, (B) showing a fragmentary sectional view;

FIG. 6 is a sectional view showing a plasma-assisted chemical etching machine;

FIG. 7 is a bar graph showing the double-side polished flatness of an alkali etched wafer according to the invention and that of a surface polished wafer;

FIG. 8 is a graph showing the surface roughness of a material wafer, which is obtained by lapping an as-cut wafer and then alkali etching the lapped wafer (Comparative Example 1), that of a material wafer, which is obtained by lapping an as-cut wafer and acid etching the lapped wafer (Comparative Example 2), and that of a product wafer, which is obtained by surface grinding an as-cut wafer and alkali etching the ground wafer (Embodiment 1);

FIG. 9 is a graph showing the flatness changing when a wafer obtained right after wire saw as-cut wafer is plasma etched and then double-side polished;

FIG. 10 shows functions of basic constructions for a well-known surface grinding technique in (A) and a first surface grinding technique adopted according to the invention in (B); and FIG. 11 shows functions of a basic construction for a second surface grinding technique adopted according to the invention.

In the figures, designated at 1 is a wafer, at 11a an upper grindstone, at 12a a lower grindstone, at 14 a carrier, at 20 a base plate, at 21 a turntable, at 22 a cup-shaped grindstone, at 29A a high pressure vacuum source, at 29B a low pressure vacuum source, at 32 a two-dimensional moving unit, at 33 a holder, at 38 a plasma chamber space, at 39 a process gas supply tube, at 40a a high frequency drive electrode, at 41 vacuum reaction chamber, at 51 a lower polishing turn table, at 52 an upper polishing turn table, at 51a and 51a a polishing pad, at 53 a center gear, at 54 an internal gear, at 55 a geared carrier, at E a slicing step, at F a chamfering step, at G a flattening step, at H an etching step, at K a double-side polishing step, at P a plasma etching step.

DETAILED DESCRIPTION OF THE PREFERRED EMBODIMENT

An embodiment of the invention will now be described with reference to the drawings. Unless particularly described, the sizes, shapes, relative positions, etc. of components described in connection with the embodiment have no sense of limiting the scope of the invention, and are merely exemplary.

Figure 2:
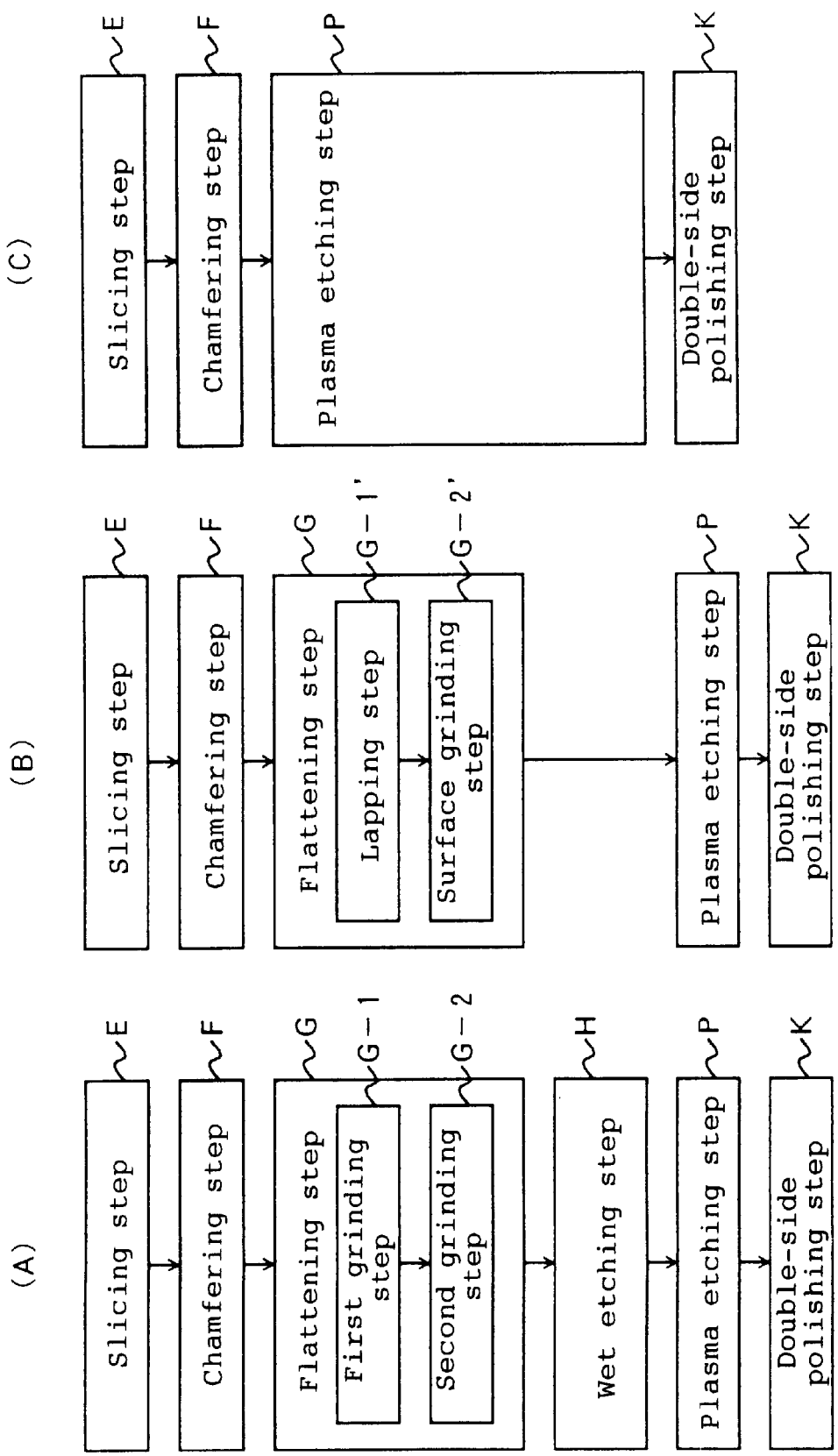

FIG. 1 is a flow chart illustrating an embodiment of the method of semiconductor wafer manufacture according to the invention. FIG. 2 illustrates flow charts in different cases of introducing a plasma dry etching step.

Referring to FIG. 1, a process of semiconductor wafer manufacture according to the invention comprises a slicing step E of slicing a semiconductor single crystal ingot into thin disc-shape wafers, a chamfering step F for chamfering sliced wafers, a flattening (or surface grinding) step G of flattening the chamfered wafers, a wet etching step H for removing cutting particles and process damage layers generated on the flattened wafer surfaces, and a double-side polishing step K for mirror-polishing the etched wafer surfaces. Material wafers to be supplied to the double-side polishing step K are obtained through the steps E to H.

The as-cut wafers right after the slicing of an ingot with a wire saw or a circular internal blade slicer in the slicing step E, have swelling with cycles of 0.5 to 30 mm as noted above and also unevenness of short cycles. In the prior art lapping process, it was difficult to remove the former swelling of long cycles, although the latter unevenness could be removed.

The flattening step G may be constituted by a first grinding step G-1 based on double-side grinding and a subsequent second grinding step G-2 for grinding the front and back wafer surfaces by single-side surface grinding. As alternatives, it may be constituted by the first grinding technique shown in (B) in FIG. 10 or by the second grinding technique shown in FIG. 11.

For improving the production efficiency and the grinding accuracy, suitably the first grinding step G-1 is carried out with a batch type grinding machine, and the second grinding machine G-2 is carried out with a single wafer type grinding machine.

As shown in (A) in FIG. 3, the double-side grinding is done on a vertical double-head double-disc grinding machine having a high rigidity structure as well-known.

Referring to the figure, the machine has an upper grindstone 11a driven at a high speed by a driving unit 12a and a lower grindstone 11b driven in the same direction and at a high speed by a driving unit 12b. A plurality of as-cut wafers 1 held by a carrier 14 which is driven in the opposite direction to the rotation of the grindstones and at a low speed, are successively fed for double-side grinding between the upper and lower grindstones 11a and 11b. The wafers are thus doubled-side ground one after another.

Shown in (B) in FIG. 3 is a batch type double-side grinding machine, which comprises an upper and a lower turn table 61 and 62 with respective grindstones 61a and 62a and rotated in opposite directions to each other. A center gear 63 is provided on the lower turn table 62 at the rotation center thereof, and an internal gear 64 is provided on the outer periphery of the lower turn table 62. A plurality of geared carriers 66, which each carry a plurality of wafers 1 each set in a wafer receiving hole 66b, are interposed between the upper and lower grindstones 61a and 62a such that they are in mesh with the center gear 63 and the internal gear 64, and undergo a planetary motion, i.e., rotation and revolution, with the rotation of the lower turn table 62 to effect simultaneous double-side grinding (i.e., batch grinding) of a plurality of wafers 1 under an adequate pressure applied by the upper turn table 61.

All the above grinding steps are for removing a major part of warp or swelling of the as-cut wafers. In any of these steps, a material free from thickness fluctuations can be formed, while forming process damage layers on both work surfaces due to the double-side grinding for preventing generation of distortion and secondary warp during grinding.

Referring back to FIG. 1, in the second grinding step G-2, the front and back surfaces of work are ground by single-side surface grinding with a vertical in-feed surface grinding machine using a cup-like grindstone.

In this embodiment, the grinding for flattening is done with the sole second grinding technique shown in FIG. 11.

As schematically shown in (A) and (B) in FIG. 4, wafers are processed one by one with a high rigidity vertical surface grinding machine. The machine comprises an upper structure, which includes a cup-like grindstone 22 driven for rotation in the direction of arrow 24 at a high speed by a driving unit 26 and vertically reciprocable in directions of arrows 26a, and a turntable 21 which is rotatable by a center shaft horizontally as shown by arrow 25 at a high speed. A base plate 20 made of a ceramic or like porous material is provided on the turntable 21. A high pressure vacuum source 29A and a low pressure vacuum source 29B are provided, to which the turntable 21 can be coupled to via a duct 28 and a switching valve 28a for chucking the base plate 20. A wafer 1 as a material is held chucked on said base plate 20, and toward the end of grinding the prevailing high pressure vacuum of −600 mm Hg is switched over to a low pressure vacuum of −50 to −100 mm Hg for spark-out to remove swelling of the wafer. Reference numeral 27 designates a drive motor for driving the turntable.

With this construction, the accuracy (i.e., fluctuations) of the feed of the vertical high-speed rotation grindstone directly constitutes the accuracy of the thickness of the wafer as material. The wafer thickness accuracy thus can be readily controlled, and wafers having stable and high flatness can be provided.

Instead of adopting the above grinding technique, the first grinding technique shown in (B) in FIG. 10 as described above, may be adopted, in which the adhesive 3 such as wax is interposed between the wafer 1 and the top surface of the base plate 2, to which the back wafer surface 1b is held, to absorb long cycle swelling or the like on said back wafer surface 1b side.

The wet etching step H shown in FIG. 1, is for removing process damage layers or the like, which have been formed on the material surfaces in the flattening step G, without spoiling the flatness obtained in the flattening step G. The flatness may be spoiled depending on the etching solution or the agitation thereof or progress of reaction during the etching. The best etching solution is an alkali solution (e.g., 45 to 50% NaOH or KOH solution).

The double-side polishing step K shown in FIG. 1, is constituted by a high efficiency, batch processing system step, in which material wafers having the thickness accuracy and flatness accuracy obtained in the previous steps E to H, are processed while preventing particle generation and suppressing processing damages as shown in the Japanese Patent Application Heisei 7-207514 noted above.

FIG. 5 shows the construction for carrying out the double-side polishing. A lower and an upper turn table 51 and 52 with respective polishing pads 51a and 52a are rotatable in opposite directions. A center gear 53 is provided on the lower turn table 51 at the rotation axis thereof. An internal gear 54 is provided on the outer periphery of the lower turn table 51. A plurality of geared carriers 55, which each carry a plurality of wafers 1 each fitted in a wafer receiving hole 55b, is provided between the lower and upper polishing pads 51a and 52a such that they mesh with the center gear 53 and the internal gear 54 for rotation in the direction of solid arrow B and revolution in the direction of dashed arrow C with the rotation of the lower plate in the direction of arrow A. A plurality of wafers 1 thus can be simultaneously polished under an adequate pressure applied by the upper turn table 52. Reference numeral 56 in the figure designates a polishing solution feeding port.

FIG. 2 shows three different forms of the method of semiconductor wafer manufacture as shown in FIG. 1 when a plasma etching step is introduced. The plasma etching step utilizes plasma-assisted chemical etching (PACE) developed by Heughes Danbary Optical Systems Inc. noted above. In this technique, thickness fluctuation data is fed back to an etching process.

In the form shown in (A) in FIG. 2, etched wafers obtained through the steps E to H shown in FIG. 1 are finely flattened as material wafers in the plasma etching step P before being fed to the double-side polishing step K.

The plasma etching step P permits removal of warp and swelling, and the conventional lapping step G-1″ can be added to the flattening step G without any problem.

In the form shown in (B) in FIG. 2, wafers formed through the steps E to G shown in FIG. 1 and after removal of minute unevenness in a lapping step G-1' and also, if necessary, flattening in a surface grinding step G-2' based on the first or second grinding step (G-1 or G-2 shown in FIG. 1), are subjected as material wafers to removal of cutting particles and process damage layers and also minute flattening in the plasma etching step P before being fed to the double-side polishing step K.

As an example, it is possible to provide the conventional lapping step G-1' in lieu of the first grinding step (G-1) and use the lapping step G-1' and the second grinding step G-2 in FIG. 1 (back/front surface single-side grinding step) for the flattening step G.

The plasma etching step P further permits flattening in addition to the removal of warp or swelling, so that it is possible to omit the flattening step G without any problem.

In the form shown in (C) in FIG. 2, chamfered as-cut wafers obtained through the steps E and F shown in FIG. 1 are subjected as material wafers to the removal of cutting particles and process damage layers and also to the flattening in the plasma etching step P before being fed to the double-side polishing step K.

The plasma-assisted chemical etching is disclosed in Japanese Laid-Open Patent Publication Heisei 6-5571, and is not described here in detail. Briefly, FIG. 6 shows an example of the construction to this end. The construction has a vacuum reaction chamber 41, which is defined by an upper, an intermediate and a lower horizontal frame 30a to 30c, cylindrical peripheral walls 31a and 31b provided between the horizontal fames 30a and 30b and between the horizontal frames 30b and 30c, respectively, and a central exhausting port 42 provided in the lower horizontal frame 30a. Cylindrical structures 30d to 30f are suspended from the upper horizontal frame 30c, and under their lower ends a plasma chamber space 38 is defined between dielectric members 36 and 37. The cylindrical structures 30d to 30f are screwed to one another to permit adjustment of their distance from and angle to the wafer 1. Reference numeral 35 designates a wafer support set on an electrically grounded holder 33.

A process gas supply tube 39 is disposed above the plasma chamber space 38, and at the ceiling thereof a high frequency drive electrode 40a and a high frequency input conductor 40 connected thereto are provided and form a central part of etching reaction.

The material wafer 1 is supported via the wafer support 35 on the electrically grounded holder 33, and a two-dimensional moving unit 32 is provided thereunder for appropriately adjusting the etching position. Although not shown, the present machine has mechanisms for adjusting high frequency power, gas pressure and temperature. Reaction gas is introduced into plasma, and high frequency power is applied thereto. The process is made controllable by controlling these operations. Selective local etching and also entire etching of the work is made possible by a noncontact operation as occasion demands.

Effects obtainable with the above steps will now be described.

1. In manufacture of material wafers ready for polishing from as-cut wafers by using the surface grinding step to the flattening step G shown in FIG. 1:

The graph in FIG. 7 shows the flatness level of material wafers, which were obtained from as-cut wafers through the conventional process alkali etching, and material wafers, which were obtained in the embodiment of the invention adopting the low pressure surface grinding step shown in FIG. 11 as the flattening step G shown in FIG. 1 for 20 $\mu$m double-side polishing the wafers obtained after flattening as-cut wafers as material using hard polishing pad (with Asker C hardness of 80 or above).

As is seen from the figure, the flatness level obtained after the double-side polishing of the surface ground wafers (embodiment) was improved by about 10% over the flatness level obtained after the double-side polishing of the alkali etched wafers (prior art).

Conversely, thickness sorting of prior art alkali etched wafers is necessary for obtaining an equal flatness level.

2. In manufacture of material wafers ready for polishing through surface grinding and etching of as-cut wafers:

FIG. 8 shows results of evaluation on surface roughness and necessary polishing stock removal so far as to get sufficiently mirror-finished surface of material wafers obtained with Comparative Examples 1 and 2 and Embodiment 1 of the invention.

With Comparative Example 1, the surface roughness (Rmax($\mu$)) was 2 to 2.5 $\mu$m and the polishing stock removal ($\mu$) were 14 to 15 $\mu$m. With Comparative Example 2, the surface roughness (Rmax($\mu$)) was 0.8 to 1 $\mu$m and the polishing stock removal($\mu$) were 7 to 10 $\mu$m. With Embodiment 1, the surface roughness Rmax($\mu$) was 0.3 to 0.5 $\mu$m and the polishing stock removal($\mu$) were 3 to 5 $\mu$m.

That is, with Embodiment 1, the surface roughness Rmax ($\mu$) and the polishing stock removal($\mu$) were improved to ⅓ to ½ compared to Comparative Examples 1 and 2.

Further, the mirror finish was also judged by observing scattered light from surface (with a usual light scattering type particle counter) and microscope examination.
a) Comparative Example 1
 Wafers obtained through alkali etching by 30 $\mu$m after lapping with FO/#1200.
b) Comparative Example 2
 Wafers obtained through acid etching by 30 $\mu$m after lapping with FO#1200.
c) Embodiment 1
 Wafers through alkali etching by 20 $\mu$m after the low pressure surface grinding shown in FIG. 11 with #2000 diamond grindstone (resin bond).

3. In manufacture of material wafers in step shown in (C) in FIG. 2 using plasma dry etching:

FIG. 9 shows the effect obtained with the embodiment using plasma-assisted chemical etching (PACE). As shown in (c) in FIG. 2, the flatness of the material as wire saw as-cut wafer chamfered after slicing, which had been about 11 $\mu$m (TTV), was greatly improved up to about 1.5 $\mu$m through plasma etching based on the PACE. By carrying out subsequent double-side simultaneous polishing of the work, a flatness of 1 $\mu$m and below could be readily obtained.

With the processes shown in (A) and (B) in FIG. 2, in which the flattening step is carried out before the plasma-assisted chemical etching (PACE), further effects can be expected.

What is claimed is:

1. A method of manufacturing a semiconductor wafer comprising the steps of:
 flattening a thin disc-shaped wafer obtained right after slicing by surface grinding, and
 polishing the flattened wafer on both sides simultaneously.

2. A method according to claim 1, wherein the wafer is chamfered after slicing and before flattening.

3. A method according to claim 1, further comprising removing process damage layers from the flattened wafer while maintaining the flatness thereof by a etching process after the flattening step and before the polishing step.

4. A method according to claim 3, further comprising after said etching process, subjecting the wafer to further process damage layer removal by dry plasma etching before the simultaneous polishing of both sides of the wafer.

5. A method according to claim 4, wherein said plasma etching comprises is plasma-assisted chemical etching.

6. A method according to claim 3, wherein said etching process is a wet etching process with an alkali etching solution.

7. A method according to claim 1, wherein the wafer is flattened by surface grinding with wax or a wax-like adhesive interposed between a back surface of the wafer and a base plate surface against which the wafer is supported by suction.

8. A method according to claim 1, wherein the wafer is flattened by surface grinding a front surface of the wafer with a grindstone at a grindstone feed pressure; a back surface of the wafer is held chucked by negative chucking pressure, and the chucking pressure is reduced for surface grinding in a spark-out time when the grindstone feed pressure is reduced.

9. A method according to claim 1, wherein said surface grinding is effected by first grinding means for two-sided grinding and second grinding means for cup-shaped grindstone in-feed surface grinding.

10. A method according to claim 1, wherein the simultaneous polishing of both sides of the wafer is carried out with a polishing pad having an Asker C hardness of at least 80.

11. A method of manufacturing a semiconductor wafer comprising the steps of:
 flattening a thin disc-shaped wafer obtained right after slicing by surface grinding or lapping;
 dry etching the flattened wafer using plasma to remove process damage layers from the flattened wafer and finely flatten the wafer, and
 polishing the flattened wafer on both sides simultaneously.

12. A method according to claim 11, wherein the wafer is chamfered-after slicing and before flattening.

13. A method according to claim 11, wherein the wafer is flattened by surface grinding with wax or a wax-like adhesive interposed between a back surface of the wafer and a base plate surface against which the wafer is supported by suction.

14. A method according to claim 11, wherein the wafer is flattened by surface grinding a front surface of the wafer with a grindstone at a grindstone feed pressure, while a back surface of the wafer is held chucked by negative chucking pressure, and the chucking pressure is reduced for surface grinding in a spark-out time when the grindstone feed pressure is reduced.

15. A method according to claim 11, wherein said plasma etching comprises is plasma-assisted chemical etching.

16. A method according to claim 11, wherein the simultaneous polishing of both sides of the wafer is carried out with a polishing pad having an Asker C hardness of at least 80.

17. A method of manufacturing a semiconductor wafer comprising subjecting a thin disc-shaped wafer obtained right after slicing to plasma dry etching to remove process damage layers and flatten the wafer, and thereafter polishing the flattened wafer on both sides simultaneously.

18. A method according to claim 17, wherein the wafer is chamfered prior to said plasma dry etching.

19. A method according to claim 17, wherein said plasma etching comprises is plasma-assisted chemical etching.

20. A method according to claim 17, wherein the simultaneous polishing of both sides of the wafer is carried out with a polishing pad having an Asker C hardness of at least 80.

* * * * *